INVENTOR.
Paul Weathers

Dec. 30, 1958 P. WEATHERS 2,866,856

CONTROLLED OSCILLATOR SYSTEMS

Filed Feb. 15, 1954 2 Sheets-Sheet 2

INVENTOR.
Paul Weathers 2,866,856
Patented Dec. 30, 1958

2,866,856

CONTROLLED OSCILLATOR SYSTEMS

Paul Weathers, Haddon Heights, N. J.

Application February 15, 1954, Serial No. 410,098
17 Claims. (Cl. 179—100.4)

Figure 1:
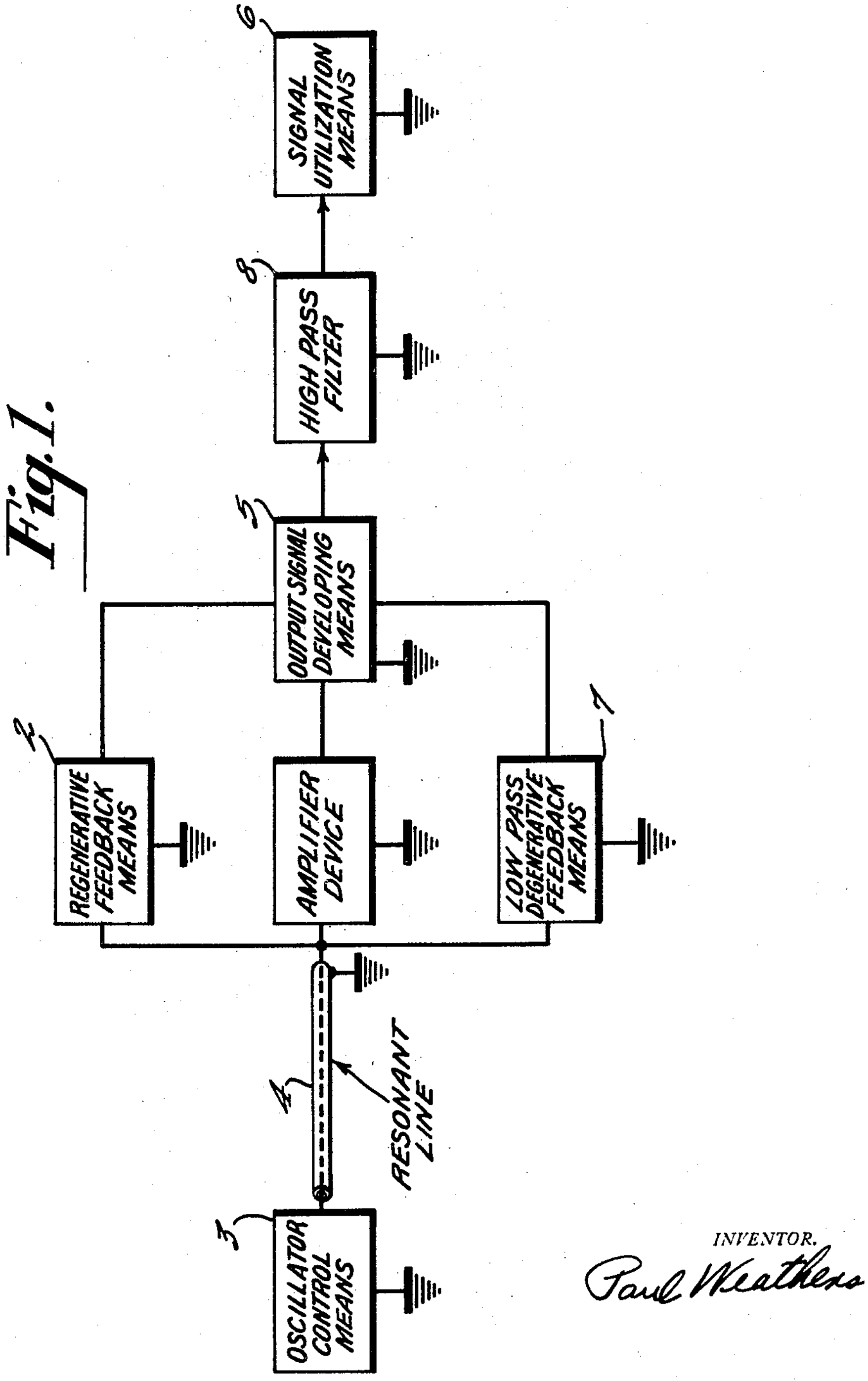

The present invention relates to improvements in controlled oscillator systems and relates more particularly although not necessarily exclusively to improvements in controlled oscillator circuitry of the type suitable for use in association with electro-mechanical systems for transducing mechanical motion into electrical signals which faithfully represent the mode of mechanical motion.

More directly the present invention relates to improvements in the electrical aspects of electromechanical transducing systems, suitable for use in the reproduction of grooved sound recordings commonly referred to as phonograph records and deals with novel methods and techniques for optimizing relations between the electrical and mechanical aspects of such systems to produce the highest fidelity reproduction of phonograph records.

In my U. S. Patent No. 2,682,579, entitled High-Frequency Modulated Oscillator Transducer System, issued June 29, 1954, I have described an improved electromechanical transducing system which permits the development of an electrical signal faithfully representing in its wave formation minute changes in the position of a mechanical tracing means suitable for engagement in the grooves of a phonograph record. The basic system disclosed in the referenced patent application involves an electrical oscillator circuit adapted for sustained oscillation at some nominal frequency preferably in the range of 20 megacycles. The oscillator disclosed is basically of the controlled tuned grid-tuned plate type. A frequency control unit comprising an LC parallel resonant circuit is coupled to the oscillator by means of a coaxial cable or transmission line so that the resonant tuned circuit comprises the tuned grid circuit of the oscillator. The capacitance element of the grid circuit is made variable and is illustrated as comprising a fixed plate in close spaced relation to a movable stylus bearing beam member, the beam member forming the other plate of the capacitor. Upon engaging the stylus in the groove of a phonograph record, the net capacity between the beam member and the fixed plate is caused to vary in accordance with the conformation of the record groove. This in turn causes a change in the tuning of the grid circuit frequency control unit which reflects a change in the termination of the transmission line. As a consequence a change in the operating mode of the oscillator is produced so that the oscillator signal is simultaneously amplitude and frequency modulated. The tuned circuit in the plate load of the oscillator stage acts with the resonant grid circuit to produce FM demodulation of the modulated oscillator signal while nonlinearity in the plate characteristic produces AM demodulation. The frequency control unit per se is hereinafter referred to variously as a pickup unit cartridge unit or plainly "cartridge."

As further described in my above referenced copending U. S. application, this change in the operating mode of the oscillator as a result of the change in the termination of the transmission line may be detected across a resistance load in the output circuit of the oscillator. By tuning both the anode circuit of the tuned grid-tuned plate oscillator and the frequency control unit or cartridge to frequencies above the desired mean frequency of oscillator operation, a very faithful electrical reproduction of the mechanical movement of the stylus bearing beam and hence the recording information on the record may be made. The linearity of overall reproduction is, as taught in the above referenced application is due to the opposite effects of FM and AM modulation of the signal have on the output signal developed in the load circuit of the oscillator. Due to the novel tuning relation of grid and plate circuits to the frequency of oscillator operation any non-linearity in amplitude modulation is, for changes in cartridge tuning below a given maximum, substantially balanced out and corrected by the effects of FM modulation produced by the same cartridge detuning.

The form of oscillator shown as suitable for use in the invention disclosed in the above identified U. S. application, although being caused to operate under discrete and novel tuning conditions, is conventional in form and includes an electron discharge tube having a time constant in the grid circuit whereby to define a typical grid leak biasing arrangement for the tube. As pointed out in the above specification, this time constant circuit lends stability to the overall operation of the oscillator in that a bias correction is made as the tube or power supply voltage aged or changed. Moreover, with such a circuit arrangement it is obvious that the time constant of the grid leak bias circuit would be determinative of the lowest frequency response capable of reproduction by the overall electromechanical system. To provide virtually flat response in record reproducing systems down to 20 cycles per second it therefore became necessary to insure that the time constant of the grid leak bias circuit was well below the period of a 20 cycle sine wave. Due to the mathematical slope or cut-off characteristic of a classical single resistance capacitance filter stage, this meant that if the system was flat down to 20 cycles per second, the response at 10 cycles per second, one octave below was only 3 db down. This caused the overall transducing system to yield substantial signal output as a function of undesirable low frequencies not intentionally present on the record and attributable to in part to well known turntable "rumble." Low frequency resonances in the arm carrying the cartridge unit were also accentuated in some instances due to this characteristic.

Moreover, in the above described system, the coupling coefficient between the termination of the transmission line and the resonant circuit comprising the frequency control cartridge unit responsive to record groove modulations was most desirably established at a point under critical coupling. Further the transmission line between the cartridge unit was ideally operated as a properly terminated transmission line on which no standing wave modes existed. Thus minute discontinuities in the transmission line itself oftentimes produced grave changes in the operating conditions of the oscillator. It was consequently found that in record reproducing systems using the novel phonograph pickup system described in my above reference application spuratic noise would develop due to natural aging and wear of the transmission line.

It is therefore an object of the present invention to provide an improved electromechanical transducer system of the variable capacitance type.

It is another object of the present invention to provide an improved electrical oscillator circuit and coupling means for use with a variable capacitance type electromechanical transducer apparatus whereby to minimize the effects of changes in the operating characteristics of elements comprising the overall system.

It is another object of the present invention to provide an improved electromechanical transducer system which overcomes certain disadvantages sometimes encountered in the illustrative embodiments of my invention described and claimed in U. S. Patent No. 2,682,579, issued June 29, 1954, entitled "High-Frequency Modulated Oscillator Transducer System."

It is still another object of the present invention to provide an improved phonograph record reproducing system in which substantially linear response is provided over the useful audible range of 15 to 20,000 cycles per second but in which lower frequency signals are highly attenuated whereby to minimize the evidence of well known turntable "rumble" and low frequency mechanical resonances sometimes present in phonograph reproducing systems.

In its broader aspects the practice of the present invention permits realization of the above objects and features of advantage through the use of an amplifier device provided with positive feedback means so as to sustain oscillation at some predetermined frequency. An oscillator control means is then coupled with the oscillator to modulate its operation in accordance with an intelligence signal having numerous frequency components. Frequency selective negative feedback means are then provided to degenerate modulation of oscillation for certain of said intelligence signal frequency components, whereby to minimize overall distortion of the intelligence signal as subsequently demodulated from the oscillator signal.

In the application of the above principles to phonograph record reproduction, the present invention contemplates the use of a tuned plate-tuned grid type oscillator circuit in which the control electrode of the amplifier means is maintained at substantially D. C. ground potential. Operating bias for the oscillator stage is provided by cathode biasing techniques. A bypass capacitor is used in the cathode bias circuit to form a time constant of a value corresponding to the lowest frequency it is desired to reproduce. Degeneration effects across the cathode bias circuit at frequencies below the desired cut-off rapidly attenuates changes in the mode of oscillator operation which tend to occur at frequencies below this cut-off value. By coupling the control electrode of the oscillator tube to the frequency control unit or cartridge with a length of transmission line equivalent to one-quarter wave length of the oscillator frequency operation, the coupling between the transmission line and the control resonant circuit per se is increased. Under these conditions, small variations in the resonance characteristics of the cartridge resonant circuit provide tremendous changes in the operating mode of the oscillator. This greatly increases the effective signal output of the transducer and yields a much higher signal to noise ratio without sacrificing desired frequency response or distortion characteristics. To further improve overall fidelity the low frequency cut-off of the system is made below any low frequency mechanical resonances or disturbances in the system. Further in accordance with one aspect of the present invention by establishing the arm resonance of the pickup system at the lowest frequency it is desired to reproduce and critically resonating the arm and cartridge at this frequency a very sharp low frequency cut-off characteristic may be provided.

Figure 2:
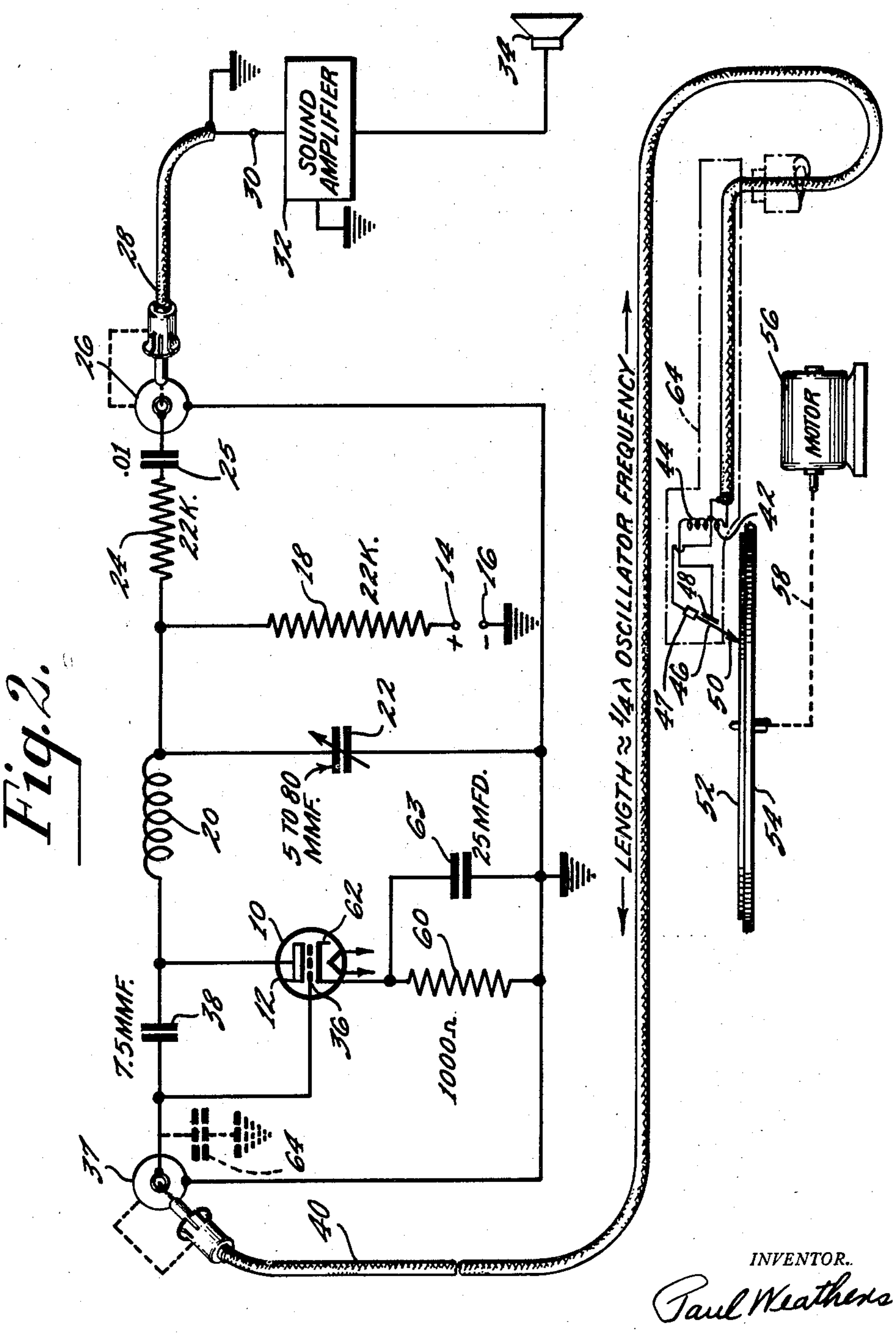

A more complete understanding of the present invention as well as a further appreciation of its objects and features of advantage will be obtained from a reading of the following specification especially when considered in connection with the accompanying drawings in which:

Fig. 1 is a block diagram representation of the basic elements comprising the present invention, Fig. 2 is a combination block and schematic representation of a phonograph record reproducing systems embodying the novel features of the present invention.

Turning now to Fig. 1 there is shown at 1 a basic amplifier device suited for use as an oscillator. Regenerative feedback means at 2 is connected to produce sustained oscillators of the amplifier and circuit at same predetermined frequency. The means 2 may be nothing more than the interelectrode impedance of the amplifier device itself. Frequency determining circuitry may be included in the input and output circuits of the amplifier. An oscillator control means 3 is shown connected with the amplifier by means of a resonant transmission line 4. The control means 3 may be of the variable impedance type whereby to cause modulation (AM and/or FM) of the oscillator. Output signal developing means 5 is connected with the amplifier to produce an output signal representing modulation of the oscillator. Assuming that the control means 3 is productive of modulation effects covering a wide band of signal frequencies the signal delivered by the output means 5 would also be wide band in nature. If, however, it is desirable to prevent certain signal frequencies from reaching the utilization means 6 filter means could be placed between the control means 3 and the amplifier, or between the output signal means 5 and the utilization means 6. It is however possible, in accordance with the present invention to provide frequency selective feedback means around the amplifier 1 so that modulation of the oscillator per se is degenerated at the undesired frequency or frequency range. Such means have been shown at 7 and by way of example is shown to be of the low pass degenerative type. If the low pass cut-off frequency of means 7 is made in agreement with any low frequency resonances inherent in the control means 3 surprising sharpness in the cut-off frequency characteristic of the system can be realized. A high pass filter 8 having a low frequency cut-off at a similar low frequency value further adds unexpected sharpness to the overall low frequency cut-off characteristic of the system. The unexpected sharpness is thought to be attributable to the interaction between the combined oscillator and modulator action obtaining with such an arrangement. A reduction in amplitude of oscillation will result in less oscillator signal amplitude which in turn will tend to cause less signal output. The degeneration enhances this effect when complemented by the resonance characteristics of the control means. Thus in variable capacitance phonograph pickup systems, the pickup arm resonance may be established at same desired low frequency cut-off value for the overall system. When the degenerative low pass filter means is provided with a similar cut-off value an extremely high attenuation of frequencies below this value occurs. High pass filter means 8 may enhance this effect by reflecting impedance changes to the oscillator at its cut-off frequency which may be caused to agree with the desired cut-off value.

In the practice of the present invention a quarter wave resonant line tuned to the mean frequency of oscillator operation may be used to couple the control means 3 with the amplifier. Under such conditions an effective improvement in sensitivity is realized as a function of the impedance step-up characteristics of a quarter wave transmission line.

A particular adaptation of the general system shown in Fig. 1 to a phonograph pickup system is shown in Fig. 2. Here is shown at 10 an amplifying device which for purposes of convenience has been shown as being of electron discharge variety. A suitable semi-conductor amplifier device could, as will be apparent as the specification proceeds, be substituted for the electron discharge tube without departing from the spirit and scope of the present invention. The amplifier 10 is connected for operation as a form of tuned plate tuned grid oscillator. Polarizing potential for the anode 12 is obtained from a power supply source having a positive terminal at 14 and a negative terminal 16. Current for amplifier operation passes from terminal 14 through a load resistor 18, through the anode or plate circuit inductor 20 and hence to the anode 12. In order to provide control of the resonance of the anode circuit a variable capacitor 22 is connected from the right hand terminal of the inductor 20 to circuit ground. Voltage variations across the load resistor 18, corresponding to changes in the power supply demands of the tuned grid-tuned plate oscillator are communicated through a coupling resistor 24 and capacitor 25 to an output terminal means 26. Signal appearing at the output terminal 26 may be conveyed by means of a shielded cable 28 to the input terminal 30 of a utilization means such as sound amplifier 32. Output signal from the sound amplifier is in turn connected to actuate a sound reproducer at 34. The distributed capacitance of the circuit including the capacitance of the cable 28 acts in conjunction with the resistor 24 as a high frequency deemphasis circuit to compensate in some degree for the preemphasis of high frequency sound components in most phonograph record recording characteristics.

The interelectrode capacitance between the anode 12 and control electrode 36 of the amplifier 10 is supplemented by means of a capacitor 38 to increase feedback between the anode and control electrode circuits. The circuit thus far described is substantially identical to that described in my above identified copending U. S. application.

In accordance with the present invention, however, the control electrode 36 of the amplifier 10 is direct current coupled via the transmission line 40 to the secondary winding 42 of what appears as an impedance transformation transformer having a primary winding at 44. Primary winding 44 acting in conjunction with the capacitance existing between a movable and mechanically damped capacitor plate 46 and a fixed capacitor plate 48, forms a turned circuit whose resonant frequency is made to vary in accordance with the undulations of the record grooves engaged by the stylus 50 while reproducing a record. By way of example a record of the common grooved disc type is shown at 52 as being placed on a turntable 54 caused to rotate by means of a motor 56. Dotted line 58 represents conventional mechanical coupling from the motor to the turntable.

In further accordance with the present invention the effective electrical length of the transmission line 40 is tailored to correspond to approximately one-quarter the wave length of the oscillator operating frequency. This means that the termination of the transmission line across the secondary winding 42 will be at a high current point or node, while the connection of the transmission line to the input terminals means 37 will be at a high voltage or minimum current point in the circuit. Under these conditions, the transmission line will itself act as an impedance transformation device which will effectively transform the impedance appearing across the secondary winding 42 to a larger value as seen by the control electrode 36 of the amplifier 10.

Further accordance with the present invention instead of conventionally placing a grid leak time constant bias circuit in series with the grid 36, a self biasing cathode resistor 60 is connected between the cathode 62 and circuit ground. The resistor 60 is bypassed by means of a capacitor 63. The time constant of the cathode bias circuit is tailored to correspond to the desired low frequency cut-off in the system. This cut-off is in accordance with the present invention, desirably established at or slightly above the resonant frequency of the mechanical system or pickup arm used to carry the cartridge elements. The arm, by way of example, has been shown in dotted lines 64. Preferably the low frequency resonance of the arm (with cartridge attached) is critically damped by damping means such as material 47 fastened to the movable plate 46. A material presently known in commerce as "Viscoloid" is quite suitable for this purpose. It is furthermore desirable to tailor the cathode bias time constant circuit to provide cut-off at a frequency above the most objectionable rumble frequency of the turntable 54. In practice a workable cut-off frequency is found to be around 15 cycles per second. To further enhance cut-off characteristics the capacitor 25 may be valued to provide a high pass filter characteristic having cut-off frequency at arm resonance.

In the operation of the circuit thus far described, the resonant frequency of the anode coil 20 taken in conjunction with the capacitor 22 and other distributed circuit capacitances is established at a frequency slightly above the desired operating frequency of the oscillator. The pickup cartridge unit including the inductor 44 and variable capacitance means 46—48 is also tuned to a frequency slightly above the desired operating frequency of the system. It is under these conditions that the well known non-linear characteristics of a two electrode variable capacitance are overcome by compensatory AM and FM modulation effects described above whereby to reduce intermodulation distortion in signals appearing across the resistor 18 to an absolute minimum. This phenomenon is more fully described and claimed in my U. S. Patent No. 2,682,579, entitled High-Frequency Modulated Oscillator Transducer System, issued June 29, 1954. By the use of this tuning technique a given change in the distance between the electrodes 46 and 48 will produce substantially the same effect on the operating mode of the oscillator (and hence the same alternating voltage output across the resistor 18) for large electrode separations as for small electrode separations.

For purposes of example certain parameters illustrated in the drawing have been given typical operating values. The values shown are to be construed only as examplary values and not as in any way limiting the scope of the present invention or the utility of the novel general circuitry indicated in the drawings. With the values shown and with the anode inductor 20 valued to provide a resonant anode circuit at 21.3 megacycles, exceptionally stable operation can be obtained from a 6AT6 type amplifier tube. With the anode circuit tuned 21.3 megacycles and the cartridge unit primary winding 44 tuned to 21.2 megacycles, the length of the transmission line L may be made to correspond to one-quarter wave length at 20.7 megacycles (about 57 inches). By arranging greater than critical coupling between the primary and secondary of the cartridge coils, the system will oscillate at or around 20.7 megacycles. This over critical coupling provides a well-known double peaked band pass characteristic between the primary 44 and secondary 42. By changing the tuning of the anode circuit, the system may be made to operate at a lower frequency coresponding to the other bandpass peak of the overcoupled transformer. In practice it will be found however that linear operation of the overall system, in which the inherent non-linear capacitance variations due to spacing in the variable capacitor element 46—48 are compensated, will be obtained only when operating the system on one peak or on one side of the double tuned characteristic resulting from overcoupling the primary and secondary windings of the cartridge autotransformer.

Furthermore in accordance with the operation of the present invention long time variations in the characteristics of the amplifier 10 as well as the value of the voltage applied at the terminal 14 will be compensated to a large extent by merit of the resultant change in current through the cathode resistor 60. However, the time constant of the cathode circuit formed by the combination of the capacitor 63 and the resistor 60 is made long enough to prevent changes in the operating mode of the oscillator at frequencies above, for example 15 cycles per second, from expressing themselves in changes in the current through the resistor 18. Thus changes in oscillator operating mode due to changes in the capacitance in the pickup unit cartridge will cause significant changes in the current through the resistor 18 only for frequencies above the chosen value of 15 cycles per second and for frequencies in excess thereof up to a limit defined at least in part by the mechanical characteristics of the movable capacitor plate 46. Since the time constant circuit formed by resistor 60 and capacitor 63 produces degeneration between the input circuit and output circuit of the amplifier 10 a surprisingly steep low frequency cut-off effect is realized in the practice of the present invention. Normally, a single stage resistance capacitor filter network is mathematically limited in its frequency characteristics to a cut-off slope of approximately 3 db per octave. However, in according with the present invention the single time constant circuit comprising resistor 60 and capacitor 63 will be taken in conjunction with an arm resonance at a frequency whose period corresponds to the time constant value of this time constant circuit provide a cut-off characteristic in excess of 18 db per octave. The value of the time constant circuit and arm resonance may be tailored to cause this cut-off characteristic at any desired frequency.

Moreover in accordance with the present invention the effective low frequency cut-off of the high pass filter comprising capacitor 25 and resistor 24 may be made to correspond to that of the cathode circuit. Under such conditions the expected low frequency cut-off slope of the system would be conventionally 6 bd per octave, 3 db per octave assignable to the cathode circuit and 3 db per octave to the high pass output filter. However, since the high pass filter forms a part of the R. F. demodulation circuit—both from the AM and FM standpoint, actual degeneration of oscillator signal modulation (excluding mechanical arm resonances) will occur at a rate greater than 6 db. In practice an unexpected additional 3 db per octave drop is realized. Furthermore as mentioned above an additional and startling increase in cut-off slope is realize when tone arm resonance is valued as above described. Tone arm resonance alone, if critically damped, will apart from the novel circuit of the present invention provide a low frequency cutoff of approximately 9 db per octave. However, when combined with the 9 db per octave slope provided by the novel cathode time constant circuit and output circuit filter, there is realized an unexpected 21 db per octave low frequency cut-off slope.

A further benefit achieved by virtue of the degenerative effect of the cathode time constant circuit alone, is that of reducing the degree of signal modulation at lower frequencies. This is helpful especially in connection with the reproduction of phonograph records in which low frequency groove excursions are of high amplitude. Under such conditions the degree of oscillator modulation is reduced for these lower frequencies thereby minimizing any tendency to produce non-linearity in signal output due to a dynamic unbalance between AM and FM corrective influences as described above.

It is to be understood although the present invention has been shown in its preferred form the merits of the individual inventive elements of novelty comprising the preferred arrangement shown, may in themselves find useful application apart from the particular circuit environment shown. Moreover, each of the elements of novelty may be employed to some degree of advantage independently of the other with optimum overall circuit performance being obtained only when all elements cooperate in the fashion shown in the drawing and as described above. For example, the advantage to be gained by turning the transmission line 40 on one-quarter wave length basis to the operating frequency of the oscillator is manifested as described above in increasing the overall sensitivity of the circuit to changes in the capacitance of the variable capacitance unit in the pickup cartridge head. Moreover, by establishing this tuned line operation standing waves on the line having nodes and antinodes at various positions intermediate the line extremities are reduced if not prohibited. In this way movement of the transmisison line, which must be flexible in most applications of phonograph record reproducing systems, at points therealong having sporadic discontinuities will not cause audible noise in the output of the oscillator circuit. If however, some compromise in operating characteristics along these lines is permissible, the line 40 may be tuned above or below the operating frequency of the oscillator or its length may be reduced and an additional circuit capacitance such as illustrated by the dotted line capacitor 64 may be added to tune the line to the desired operating frequency. Moreover, the advantages of tuning the transmission line are not entirely lost by repositioning the time constant circuit in the oscillator from the cathode circuit thereof to the grid circuit. However as pointed out above signal to noise ratio will suffer as well as the production of an extended low frequency response which may be in some instances undesirable due to turntable rumble, mechanical resonces or other equivalent disturbances.

Having thus described by invention, what is claimed is:

1. In a controlled oscillator system for operation at a desired mean frequency of oscillation, the combination of: an amplifier device having an input circuit and an output circuit; means coupling said input circuit with said output circuit to produce oscillation in said amplifier; a transmission line means tuned to approximately one-quarter wavelength of the desired frequency of oscillator system operation; means coupling one end of said transmission line to the input circuit of said amplifier device; a control circuit comprising an inductance element and a capacitance element, at least one of said elements being mechanically controllable in value, said elements being so connected with one another as to form a resonant circuit, the resonant frequency of which is in turn mechanically controllable; means coupled to said inductance element for establishing a pair of coupling access terminals across which is sustained a relatively low value of impedance, the exact value of which is a function of the controllable value of resonance sustained by said control circuit; and means coupling the other end of said transmission line to said pair of coupling access terminals.

2. A controlled oscillator circuit according to claim 1 wherein the mechanically controllable element included in said control circuit is said capacitance element comprised of two electrodes, one of said electrodes being resiliently movable with respect to the other, a tracing stylus, adapted to engage the grooves of a grooved recording medium, said stylus being fixed to said movable electrode; a movable arm for carrying said control circuit in operative relation to a grooved recording to permit said stylus to engage the grooves thereof, the masses of said arm and control circuit acting with said resiliently movable electrode to form a mechanically resonant system when said stylus is operatively engaging a record groove; damping means coupled to said movable electrode to critically damp said resonant system; and a frequency selective degenerative feedback means connected to said amplifier device to produce an increase in the amount of degeneration as an inverse function of frequency for frequencies at and below the approximate resonant frequency of said mechanically resonant system.

3. A controlled oscillator system according to claim 2 wherein said amplifier device is an electron tube connected as a tuned grid tuned plate type oscillator; and wherein said frequency selective degenerative feedback means comprises a resistance capacitance time constant circuit connected in common with both said input and said output circuits.

4. In a controlled oscillator system according to claim 2 wherein there is additionally provided means connected in said amplifier output circuit responsive to current flow therethrough to develop an output signal representing intelligence borne by said grooved recording; utilization means for said output signal; and a high pass filter means coupled between said output signal developing means and said utilization means; said high pass filter having a low frequency cutoff in the immediate frequency range of said mechanical system resonance.

5. In a controlled oscillator system the combination of: an oscillator comprising an amplifier device having regenerative feedback means between its input circuit and output circuit to produce an oscillation; means coupled with said oscillator to vary said oscillation in accordance with intelligence signal information having various components of different frequency ranges; frequency selective degenerative feedback means coupled with said oscillator so as to degenerate changes in said oscillation variations more for low frequency ranges of intelligence signal than for high frequency ranges of intelligence signal; and means coupled with said oscillator for developing an output signal in response to variations in said oscillation.

6. A controlled oscillator system according to claim 5 wherein said frequency selective degenerative feedback means is substantially a low pass filter; a signal utilization terminal means to which said output signal is to be coupled; and another high pass filter means coupled between said output signal developing means and said terminal means; the cutoff frequency of said second named high pass filter means being in the same relative range of frequency as the cutoff frequency of said low pass filter.

7. A controlled oscillator system according to claim 6 wherein said oscillator oscillation varying means is a phonograph record pickup device undesirably responsive to signals below a given minimum frequency value; and wherein said high pass and low pass filter include means to establish said cutoff frequencies in correspondence with said minimum frequency value.

8. A controlled oscillator system according to claim 7 wherein said phonograph pickup device includes means establishing a low frequency mechanical resonance in said device at a frequency value about said minimum; and means included in said pickup active to substantially critically damp said pickup at said low frequency resonance.

9. A controlled oscillator system according to claim 7 wherein said phonograph pickup device is of the variable capacitance type; and wherein said pickup is coupled with said oscillator by means of a transmission line terminated and dimensioned to produce resonance in said line at the mean frequency at which it is desired to operate said oscillator.

10. In a controlled oscillator system the combination of: an oscillator connected for operation at a predetermined mean frequency said oscillator including an amplifier device having an input circuit and an output circuit regeneratively coupled with one another; an oscillation control circuit connected to form a part of said oscillator; said control circuit comprising a variable capacitance element connected in combination with an inductance element to form a resonant circuit; a transmission line coupled with said input circuit for coupling said control circuit thereto, said transmission line being resonant at substantially said mean frequency; coupling means between said transmission line and said inductance element to overcritically couple said resonant circuit to said transmission line so as to produce a double peaked frequency response characteristic; a resonant circuit connected in the output circuit of said amplifier, the resonant value of said resonant circuit corresponding to one of said peaks in said transmission line; and means connected in said output circuit to develop a signal in response to variations in said oscillator oscillation due to the influence of said control circuit.

11. In a phonograph record reproducing system the combination of: an oscillator including an amplifying device having operative electrodes corresponding to an electron tube anode, cathode and control electrode, said oscillator including means operative to establish oscillator operation at a predetermined mean frequency; a circuit ground; a transmission line of a length causing said line to be resonant at a frequency substantially equal to said mean frequency, said line having one extremity direct current connected between said control electrode and circuit ground; a variable capacitance pickup device operatively connected to the other extremity of said transmission line so as to vary said oscillator oscillation in accordance with the value of said variable capacitance device; a resistance capacitance time constant circuit connected in self biasing relation to said cathode means connected with said anode electrode for developing an output signal representing the variations of said oscillation and hence the mode of variable capacitance pickup unit capacitance change.

12. In a phonograph record reproducing system the combination of: a tuned grid tuned plate type oscillator including an electron discharge tube having an anode, cathode and control electrode, said oscillator being designated to operate at a predetermined mean frequency; a circuit ground; a transmission line having one extremity direct current connected between said control electrode and circuit ground, the length of said transmission line being established to tuned, on a quarter wavelength basis to the mean frequency of said oscillator; a variable capacitance pickup device direct current connected to the other extremity of said transmission line so as to vary said oscillator oscillation in accordance with the value of said variable capacitance device; a resistance capacitance time constant circuit connected in a self biasing relation to said cathode and circuit ground; and a load means connected with said anode for developing an output signal representing the variations of said oscillation and hence the mode of variable capacitance pickup unit capacitance change.

13. In a phonograph record reproducing system designated to reproduce signal frequencies above a predetermined minimum the combination of: a tuned grid tuned plate type oscillator including an electron discharge tube having an anode, cathode and control electrode, said oscillator being designated to operate at a predetermined means frequency; a circuit ground; a transmission line having one extremity direct current connected between said control electrode and circuit ground; a variable capacitance pickup device direct current connected to the other extremity of said transmission line so as to vary said oscillator oscillation in accordance with the value of said variable capacitance device; a resistance capacitance time constant circuit connected in self biasing relation to said tube cathode and circuit ground, the value of said time constant being substantially greater than the period of the minimum signal frequency said sound reproducing system is designated to reproduce; load means connected with said anode for developing an output signal representing the variations of said oscillation; and high pass filter means included in said load means, the cutoff frequency of said filter being substantially equal to said minimum signal frequency of reproduction.

14. A phonograph record reproducing system according to claim 13 wherein said variable capacitance pickup device is mounted in and carried by a tone arm which produces a resonance with said pickup device substantially at said minimum signal frequency said sound reproducing system is designated to reproduce.

15. In a variable capacitance type phonograph record reproducing system, the combination, a tone arm designated to carry a pickup; a variable capacitance pickup device mounted on said arm to form a combination with said arm, said pickup device comprising resilient structure coacting with said arm to produce a damped mechanical resonance in the characteristics of said combination at some lower frequency of reproduction; an oscillator connected with said pickup device for modulation thereby; a degenerative feedback circuit connected around said oscillator and adapted to feedback signals whose frequencies are below said lower frequency of reproduction; and means connected with and responsive to said oscillator to develop an output signal representing the mode of oscillator modulation.

16. In a phonograph reproducing system the combination of: a stylus bearing phonograph pickup unit; an arm adapted to hold said pickup unit as it traverses the grooves of a recording said pickup unit and arm comprising coacting mechanical structure including a resilient member and having a resonant frequency in the lower range of the sound spectrum; means for substantially critically damping the resonance of said mechanical system; a sound reproducing system connected to said pickup unit to reproduce signals developed thereby; and a high pass filter intercalated between said pickup unit and said sound reproducing system, said high pass filter including means therein to establish a cutoff frequency substantially at the resonant frequency of said mechanical system.

17. In an electromechanical motion transducing system for transducing the motion of a movable motion sensing mechanical member into electrical signal intelligence depicting the character of said motion, the combination of: a control means comprising a tuned circuit including the parallel combination of an inductor and a capacitor nominally resonant to a predetermined radio frequency, said control means including a movable mechanical member coupled to said tuned circuit for varying the exact value of said resonant frequency; means coupled with said tuned circuit for defining two output terminals for said control means, the output impedance appearing across said output terminals being established at a relatively low nominal value which at said predetermined radio frequency varies in character and value with said variations in said resonant frequency; a controllable frequency oscillator circuit means having two frequency controlling input terminals sustaining a higher terminal impedance than said relatively low output terminal impedance of said control means, the frequency of oscillator operation being sensitive to the character and value of circuit impedance appearing across said input terminals, the nominal operating frequency of said oscillator being electrically determined as substantially the same as the nominal value of said tuned circuit resonance; means included in said oscillator circuit means for developing a motion indicating output signal representing changes in oscillator frequency, said oscillator circuit having inherent undesirable noise generating characteristics; a tuned transmission line means representing an electrical length approximately one-quarter wavelength of said predetermined radio frequency; means connecting one end of said transmission line to said control means output terminals; and means connecting the other end of said transmission line means to said frequency controlling input terminals so that relatively minute changes in the resonant frequency of said tuned circuit produce relatively large changes in the operating frequency of said oscillator circuit means with an attending development of a relatively high signal to noise ratio in said developed motion indicating signal.

References Cited in the file of this patent

UNITED STATES PATENTS

| | | |
|---|---|---|
| 1,544,001 | Groenebaum | June 30, 1924 |
| 2,436,129 | Weathers | Feb. 17, 1948 |
| 2,436,946 | Tatro | Mar. 2, 1948 |
| 2,481,886 | Sinnett | Sept. 13, 1949 |
| 2,556,040 | Miller | June 5, 1951 |
| 2,563,098 | Brown | Aug. 7, 1951 |